United States Patent [19]

Butler

[11] 4,016,953

[45] Apr. 12, 1977

[54] PUSH-PULL TRANSDUCER SYSTEM

[76] Inventor: Robert J. Butler, 11605 Terry Town Drive, Reisterstown, Md. 21136

[22] Filed: May 23, 1975

[21] Appl. No.: 580,250

[52] U.S. Cl. ............................... 181/144; 179/116; 181/163; 181/171

[51] Int. Cl.[2] ..................... H05K 5/00; H04R 13/02

[58] Field of Search .......... 181/144, 163, 148, 156, 181/171, 173, 174, 199; 179/116, 115 R, 1 GP, 1 E, 1 GA

[56] References Cited

UNITED STATES PATENTS

| | | | |
|---|---|---|---|
| 1,759,556 | 5/1930 | Hutchison | 181/163 |
| 1,931,885 | 10/1933 | D'Amour | 181/148 |
| 2,812,033 | 11/1957 | Young | 181/171 |
| 2,832,843 | 4/1958 | Miessner | 181/163 |
| 2,993,091 | 7/1961 | Guss | 181/144 |
| 3,477,540 | 11/1969 | Rizo-Patron | 181/144 |

*Primary Examiner*—Stephen J. Tomsky
*Attorney, Agent, or Firm*—Walter G. Finch

[57] ABSTRACT

A push-pull transducer system is provided for the reproduction of high fidelity sound to be used with amplifiers or receivers of high quality. The system consists of connecting two loudspeakers of the same size in face-to-face relationship so that where they are joined or bolted to face each other, there is provided an airtight connection.

These loudspeakers can be joined directly together using a sealant for the airtight connection, or they can be attached to a mounting board, using sealing rings, if necessary. The loudspeakers are connected in series to produce push-pull air currents for the production of sound.

6 Claims, 8 Drawing Figures

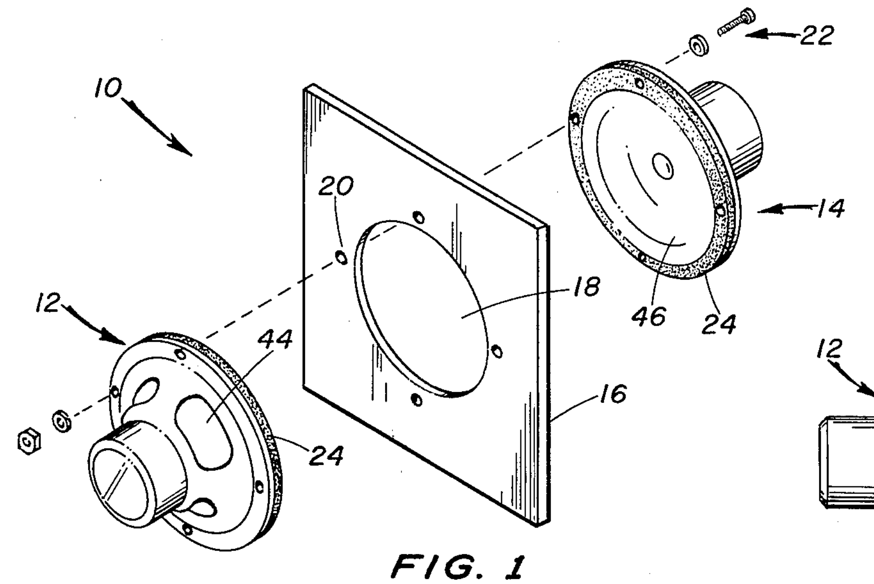
FIG. 1
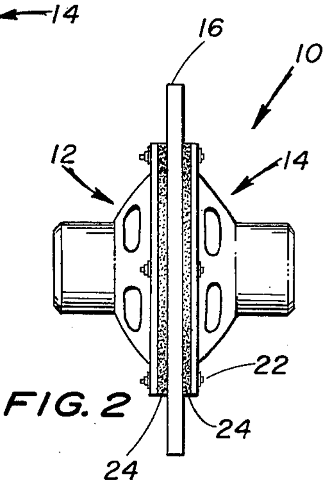
FIG. 2
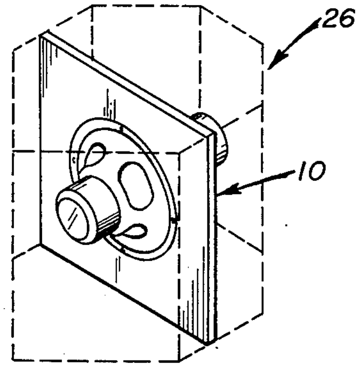
FIG. 3
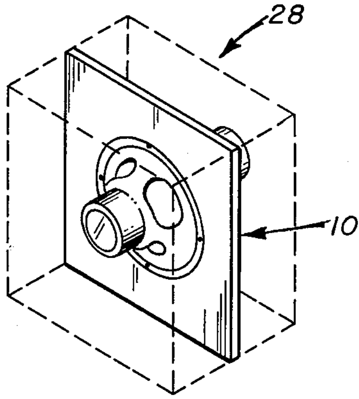
FIG. 4
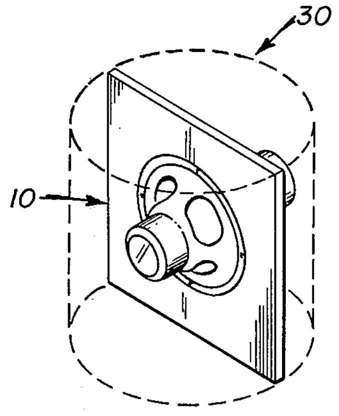
FIG. 5
FIG. 6
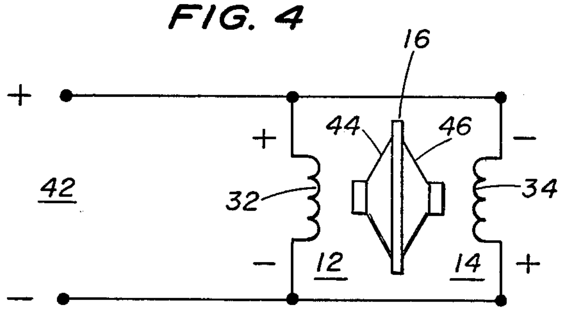
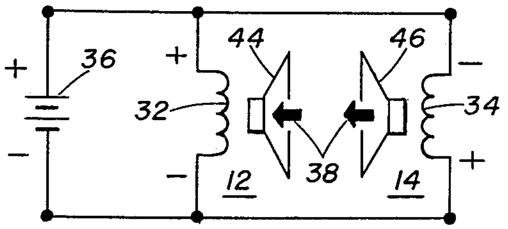
FIG. 7
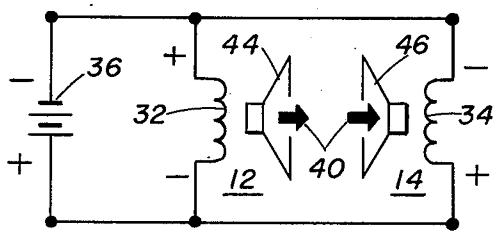
FIG. 8

PUSH-PULL TRANSDUCER SYSTEM

BRIEF BACKGROUND OF INVENTION

This invention relates generally to loudspeaker systems, and more particularly to a push-pull transducer system for the reproduction of high fidelity sound.

BRIEF SUMMARY OF INVENTION

It is an object of this invention to provide a push-pull transducer system for the reproduction of high fidelity sound.

Still another object of this invention is to provide a push-pull transducer system for reproduction of high fidelity sound which can be utilized with any high quality amplifier or receiver as currently manufactured and produced.

To provide a push-pull transducer system formed of two loudspeakers positioned face-to-face, which will allow for the reproduction of high fidelity sound, is another object of this invention.

Still another object of this invention is to provide two loudspeakers mounted facing each other and with their voice coils connected in proper phase to give a push-pull action so as to produce an omni-directional audio sound.

BRIEF DESCRIPTION OF DRAWINGS

Other objects and attendant advantages of this invention will become more apparent and understood from the following drawings and accompanying specification wherein:

FIG. 1 is an exploded view of a push-pull transducer system incorporating features of my invention showing the method of mounting two loudspeakers onto a baffle board;

FIG. 2 is a side view of the two loudspeakers mounted on a baffle board;

FIG. 3 is a phantom view showing a loudspeaker unit mounted in a corner type enclosure;

FIG. 4 is a phantom view showing a loudspeaker unit mounted in a square or rectangular type enclosure;

FIG. 5 is a phantom view showing a loudspeaker unit mounted in a cylindrical type enclosure;

FIG. 6 is a schematic of a electrical diagram for a loudspeaker unit;

FIG. 7 is a schematic of the electrical diagram of FIG. 6 showing a test set-up to demonstrate the push-pull action of the loudspeaker voice coils; and FIG. 8 is a schematic of the electrical diagram of FIG. 6 showing a test set-up to demonstrate the push-pull action of the loudspeaker voice coils.

DETAILED DESCRIPTION

Referring now to FIGS. 1 and 2 of the drawings, there is shown a push-pull transducer system 10 for the reproduction of high fidelity sound to be used with any high quality amplifier or receiver. This transducer system 10 is formed by joining face-to-face two loudspeakers 12 and 14 of the same size so that an airtight connection is produced where they are joined or bolted to face each other.

The loudspeakers 12 and 14 can be joined directly together using a sealant for the airtight connection, if necessary. They can also be attached to a mounting or baffle board 16 having a cutout 18 therein, using sealing rings 24 if necessary, as shown in FIG. 2 of the drawings.

The loudspeakers 12 and 14 are held to the mounting board or baffle 16 by means of bolts 22 passed through apertures and held together by nuts.

In order to produce the push-pull air currents for the production of sound, the two loudspeakers 12 and 14 are connected in series, i.e., the positive terminal of the loud-speaker 12 is connected to the negative terminal of the loud-speaker 14 and the negative terminal of the loudspeaker 12 is connected to the positive terminal of the loudspeaker 14 as shown in FIG. 6.

Leads from the terminals of either loudspeaker 12 or loudspeaker 14 are then connected in parallel to an audio source 42, for example, an amplifier or receiver. As shown, the positive terminal of the loudspeaker 12 is connected to the positive terminal of the amplifier or receiver 42 and the negative terminal of the loudspeaker 12 is connected to the negative terminal of the amplifier or receiver 42.

In operation, when a signal (audio) or current is induced into the transducer system 10, this signal causes the transducer system 10 to move as a unit either forwardly or backwardly depending upon the direction of the applied current or signal, as illustrated in FIGS. 7 and 8.

This is easily demonstrated with the use of a flashlight battery 36, shown in FIGS. 7 and 8, by connecting the two loudspeakers 12 and 14 in series as described previously, but without joining them together so that their cone action may be observed. Each loudspeaker 12 or 14 is provided respectively, with a cone 44 or 46, as shown in FIGS. 1, 6, 7, and 8.

When the battery 36 is connected in parallel with the loudspeaker 12 (plus terminal of the battery 36 to the plus terminal of the loudspeaker 12 and the minus terminal of the battery 36 to the minus terminal of the loudspeaker 12), it will be observed that simultaneously, the cone 44 of loudspeaker 12 will move outwardly and the cone 46 of the loudspeaker 14 will move inwardly, as shown in FIG. 7.

By reversing the connections of the battery 36 or connecting the loudspeakers 12 in series with the battery 36 (that is, connecting the plus terminal of battery 36 to the minus terminal of the loudspeaker 12 and then connecting the negative terminal of the battery 36 to the plus terminal of the loudspeaker 12) the reverse of the above occurs, as shown in FIG. 8. The cone 44 of speaker 12 moves inwardly and the cone 46 of speaker 14 moves outwardly. This in effect stimulates the constant change in direction of the audio currents that are induced in the transducer system 10 sent by the amplifier or receiver 42.

When the two speakers 12 and 14 are joined together to form the push-pull transducer system 10, as described, and a signal (audio) or current is induced in the transducer, it is this simultaneous inward and outward motion of the loudspeakers 12 and 14 and the way in which they are facing each other, which causes this motion to be in the same direction relative to the induced signal and creates a push-pull movement of the transducer 10 recreating the signal.

This push-pull transducer system 10 utilizes two eight inch loudspeakers 12 and 14, although other sizes can be utilized. These loudspeakers 12 and 14 on the market as musical instrument speakers reproduce nearly the entire audible frequency range.

This push-pull transducer system 10 can be constructed in modules using two loudspeakers of any manufacture for each module and designed for specific bands of the audio frequnecy range, i.e., push-pull transducers using two woofers (for low frequencies of 20 – 500 cycles, or whatever); two mid-range speakers (for frequencies of 500 – 2,000 cycles, or whatever and two tweeters for frequencies of 2,000 cycles and beyond, or whatever).

The only restriction is that the loudspeakers 12 and 14 should be of cone design or of some other design that they may be joined and connected as described to produce the pushpull motion for the recreation of the induced signal or current.

FIGS. 3, 4, and 5, show various types of enclosures for use of the push-pull transducer system 10, such as a corner enclosure 26, a rectangular type enclosure 28, and a cylindrical type enclosure 30, as desired.

Obviously many modifications and variations of the present invention are possible in light of the above teachings. It is, therefore, to be understood that within the scope of the appended claims the invention may be practiced otherwise than as specifically described.

What is claimed is:

1. A push-pull transducer system for reproduction of high fidelity sound, comprising:

two loudspeaker means each including a cone and a drive means, the loudspeaker means being coaxially disposed relative to each other with the base of each cone of each said means being disposed in facing relation to the base of the other of the cones to define a chamber therebetween;

sealing means between the two cones for sealing the aforesaid chamber to render said chamber impervious to transfer of fluid to or from the ambient environment of the system;

audio means; and, means for connecting said loudspeaker drive means in series to the audio means, stimulation of the loudspeaker means by the audio means causing push-pull air currents to be produced.

2. The system of claim 1 wherein the sealing means comprises a sealant.

3. The system of claim 1 wherein the sealing means comprise at least one sealing ring.

4. The system of claim 1 and further comprising:

baffle board means having an opening therein and being disposed between the cones, said bases of said cones being aligned in face-to-face surmounting relation to said opening, the sealing means being disposed on each side of the baffle board means between said baffle board means and the annular perimetric edge of the base of each cone, the sealing means forming an airtight connection between each cone and the baffle board means.

5. The system of claim 4 wherein the sealing means comprise at least one annular sealing ring disposed about the annular perimetric edge of the base of each of the cones.

6. The system of claim 1 wherein the cones of each loudspeaker means are of the same size, the loudspeaker means each having the same auditory characteristics.

* * * * *